United States Patent
Chen et al.

[11] Patent Number: 5,696,016
[45] Date of Patent: Dec. 9, 1997

[54] PROCESS FOR MANUFACTURING A CMOSFET INTERGRATED CIRCUIT

[75] Inventors: Ming-Liang Chen; Chih-Hsun Chu, both of Hsinchu, Taiwan

[73] Assignee: Mosel Vitelic Inc., Hsinchu, Taiwan

[21] Appl. No.: 746,765

[22] Filed: Nov. 15, 1996

[51] Int. Cl.⁶ .................................................. H01L 21/70
[52] U.S. Cl. ...................... 437/57; 437/34; 437/44; 437/45
[58] Field of Search ..................... 437/34, 44, 56, 437/57, 58, 45

[56] References Cited

U.S. PATENT DOCUMENTS

| | | | |
|---|---|---|---|
| 4,722,909 | 2/1988 | Parrillo et al. | 437/34 |
| 5,141,890 | 8/1992 | Haken | 437/44 |
| 5,439,834 | 8/1995 | Chen | 437/58 |
| 5,610,088 | 3/1997 | Chang et al. | 437/34 |

*Primary Examiner*—John Niebling
*Assistant Examiner*—Long Pham
*Attorney, Agent, or Firm*—Bacon & Thomas

[57] ABSTRACT

The present invention relates to a new process for fabricating integrated circuits, and more particularly, to a CMOS IC process method of low cost, shallow junction and no crystal defects. After the gate oxide and gate electrodes have been formed on the N-well and the P-well, an N⁻ Lightly-Doped-Drain (N⁻ LDD) is made, then the sidewall of the N-channel polysilicon gate and the P-channel polysilicon gate are covered with dielectric spacer. A layer of PhosphoSilicateGlass (PSG) is thereafter deposited and patterned on the N-well and the pickup area of the P-well by lithography and etching techniques. Ion implantation is used to build the P⁺ Source/Drain (S/D) electrode, after which the sidewall spacer of the P-channel polysilicon gate is removed and a blanket implantation of P dopant forms the P⁻ LDD on the area of the N-well. The P-well is doped with N-type dopant with its source from PSG by high temperature diffusing and forms the N⁺ S/D electrode.

9 Claims, 4 Drawing Sheets

PROCESS FOR MANUFACTURING A CMOSFET INTERGRATED CIRCUIT

BACKGROUND OF THE INVENTION

1. Field of the Invention

The present invention relates generally to the field of fabrication of integrated circuits, and more particularly, to a process for manufacturing CMOSFET IC.

2. Description of the Prior Art

In the conventional method of manufacturing MOSFET IC, the making of Lightly Doped Drain (LDD) and Source/Drain (S/D) electrodes requires multiple steps of ion implantation and lithography. The photoresist has to be patterned for gate definition, $N^-$ LDD implant, $P^-$ LDD implant, $P^+$ S/D implant and $N^+$ S/D implant, respectively. With this prior art approach, the expensive lithographic steps increase the cost of the product and reduce the efficiency of production. It is known in the prior art that ion implantation may cause damage to the crystal structure and reduce the yield of the product. Moreover, the depth of the junction cannot be effectively reduced which hinders the miniaturization of the device.

The following prior art references are noted.

1. Chen, John Y., *CMOS Devices and Technology for VLSI*, Prentice-Hall, Englewood Cliffs, N.J., 1990, pp 128–136.

2. Ghandhi, Sorab K., *VLSI Fabrication Principles*, John Wiley & Sons, New York, N.Y., 1983, pp. 593–595.

3. U.S. Pat. No. 5,340,756 to Nagayasu, the entire disclosure of which is herein incorporated by reference, entitled "Method for Producing Self-Aligned LDD CMOS, DMOS with deeper S/D and P-Base Regions and, Bipolar Devices on a Common Substrate".

4. U.S. Pat. No. 5,518,945 to Bracchitta et al., the entire disclosure of which is herewith incorporated by reference, entitled "Method of Making a Diffused Lightly Doped Drain Device with Built in Etch Stop".

SUMMARY OF THE INVENTION

In view of the foregoing, it is a primary object of the present invention to provide a reliable and very efficient process for manufacturing MOSFET ICs.

It is a further object of the invention to provide a CMOSFET integrated circuit with shallow junction and no crystal defects.

This invention utilizes a method employing PSG (phosphorsilicate glass) as the dopant source to make the S/D junction. The present invention reduces the number of lithographic steps involved, avoids the damage caused by ion implantation and controls the junction depth to within 0.1 micron.

The process steps are described as follows.

Ion implantation and high temperature diffusion techniques are used to define the N-well and the P-well areas on the silicon substrate. Local Oxide of Silicon (LOCS) isolation is formed between the N-well and P-well areas, and PMOS field and NMOS field threshold blanket implantation is made to adjust the threshold voltage after the field oxide has been formed.

After stripping the photoresist and cleaning the wafer, the gate oxide and a layer of polysilicon are formed on top of the N-well and the P-well, sequentially. Using lithography and RIE, the polysilicon layer is patterned to create the N channel polysilicon gate on the P-well and the P channel polysilicon gate on the N-well. Blanket implant is then used to implant N dopant into the area of P-well not covered by the N channel polysilicon gate, which finishes the formation of the $N^-$ LDD. Thereafter, sidewall spaces are formed on the edges of the polysilicon gates by depositing a dielectric layer, followed by an anisotropical etchback technique, RIE process.

A layer of PhosphoSilicateGlass (PSG) is deposited and patterned by using lithography and RIE. The PSG covering the N-well and the pickup area of the P-well is formed and later implanted with ions to build the $P^+$ S/D.

The first dielectric sidewall spacer of the P channel polysilicon gate is removed, and blanket implantation is used to establish P dopant into the area of N-well not covered by the P channel polysilicon gate, and finish the $P^-$ LDD.

Next the N dopant from its source PSG is driven into the P-well by a high temperature diffusion process to make the $N^+$ S/D. Completing the fabrication of the CMOSFET IC by making the metalization and passivation layer then proceeds.

DETAILED DESCRIPTION OF THE INVENTION

The invention disclosed herein is directed to a method for the fabrication of MOSFET IC. The process steps are now described with reference to drawings.

Figure 1:
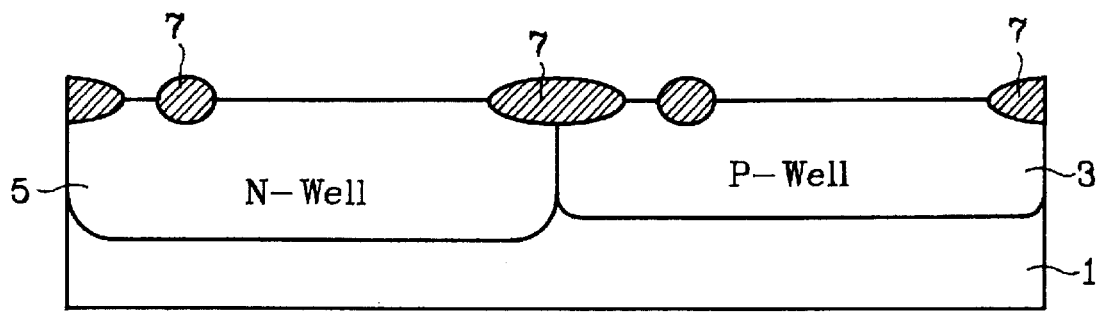
FIG. 1 shows the cross-sectional view of a twin-well CMOS region formed on a silicon substrate.

Refer to FIG. 1. The P-well 3 and N-well 5 are formed on the (100) oriented silicon substrate 1 by employing ion implantation and high temperature diffusion techniques.

The ion species used to make the P-well 3 may be $B^{11}$ or $BF_2$ with dosage ranges from 1E11 to 1E13 atoms/cm² and ion energy from 10 to 80 keV. The ion species used to make the N-well 5 is $P^{31}$. Its dosage ranges from 1E11 to 1 E13 atoms/cm² and the ion energy used can range from 50–150 keV; or $As^{75}$ can be used with dosage of 1E11 to 1E13 atoms/cm², ion energy 100–300 keV.

High temperature diffusion follows the ion implantation, and the temperature used is in the range of 1100°–1200° C. Diffusion time is in the range of 30–150 minutes. Then, the field oxide (7) is deposited and patterned on the silicon substrate between the N-well 5 and the P-well 3. The field oxide thickness ranges from 3500–6500 Angstroms, and generally is made by oxidizing the P-type silicon substrate 1. This oxide layer is for isolating.

Figure 2:
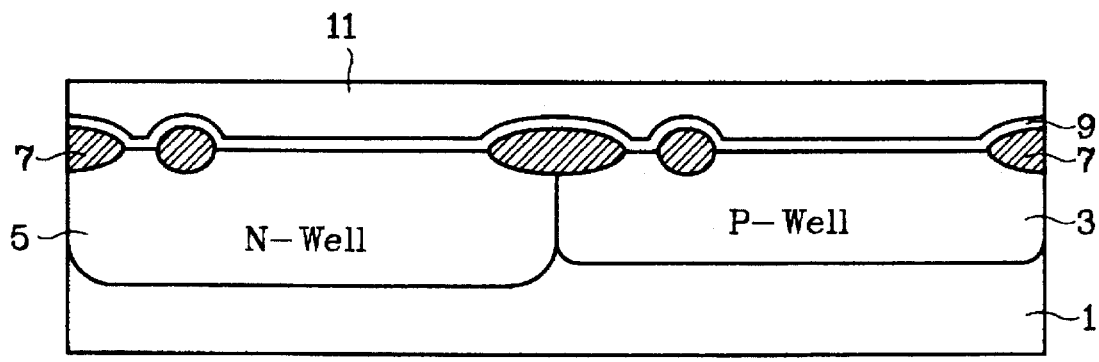
FIG. 2 shows the cross-sectional view of a silicon substrate having a layer of gate oxide formed on the silicon substrate, and a layer polysilicon gate on the gate oxide layer.
Figure 3:
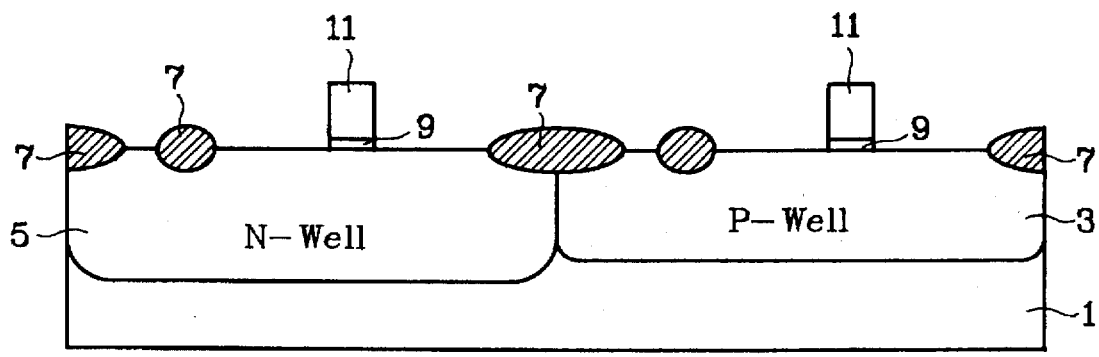
FIG. 3 shows the cross-sectional view of a silicon substrate formed polysilicon gate structures of a twin-well CMOS region.

Referring to FIGS. 2 and 3, adjustment of the device's threshold voltage precedes the building of the gate oxide layer 9. Blanket implantation of $B^{11}$ or $BF_2$ into the N-well and the P-well is used to adjust the threshold voltage of the P-channel devices. The blanket implantation, not shown in the figure, employs ion dosage of about 1E11 to 1E12 atoms/cm², and the ion energy ranges from 20 to 80 keV.

Gate oxide 9 and polysilicon layer 11 are deposited sequentially, as shown in FIG. 2.

Next, polysilicon layer 11 is patterned by lithography and RIE technology to form the N-channel polysilicon gate 11 on the P-well 3 and the P-channel polysilicon gate 11 on the N-well 5, as shown in FIG. 3.

The gate oxide 9 is made by thermal oxidation of the P-type silicon substrate 1 with oxidation temperature ranges from 850°–950° C. and thickness ranges from 80 to 200 Angstroms. The polysilicon layer 11 is made by the synchronous doping low pressure CVD process with $PH_3$ as reaction gas. Deposition temperature ranges from 550°–600° C., and the oxide thickness ranges from 2500–4000 Angstroms. Etching of the polysilicon layer can be done by magnetic-enhanced RIE (MERIE), or conventional RIE. MERIE is used most often for the submicron IC fabrication process, and the reaction agent, in this case, can be $CCl_4$, $Cl_2$ or HBr.

Figure 4:
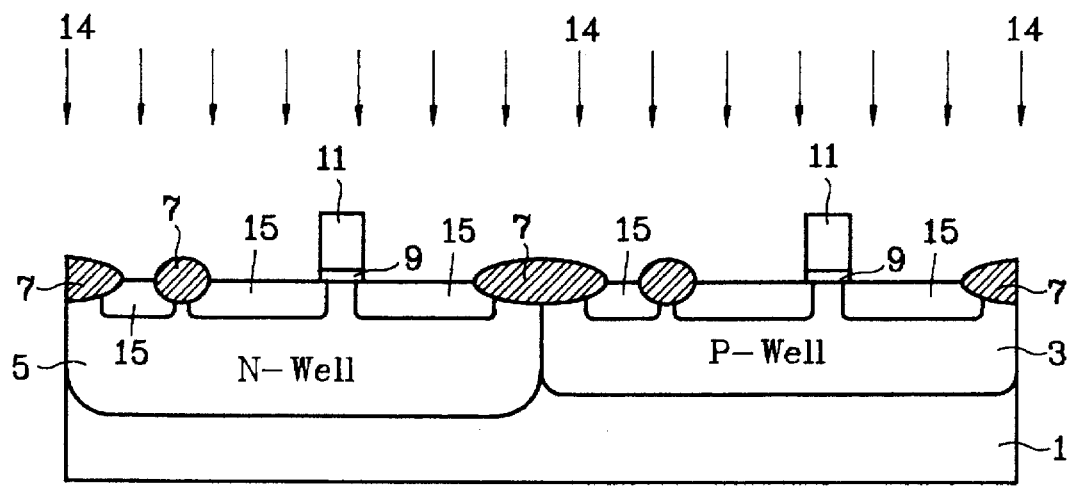
FIG. 4 shows the cross-sectional view of a silicon substrate formed N lightly doped regions of a twin-well CMOS region by ion implantation.
Figure 5:
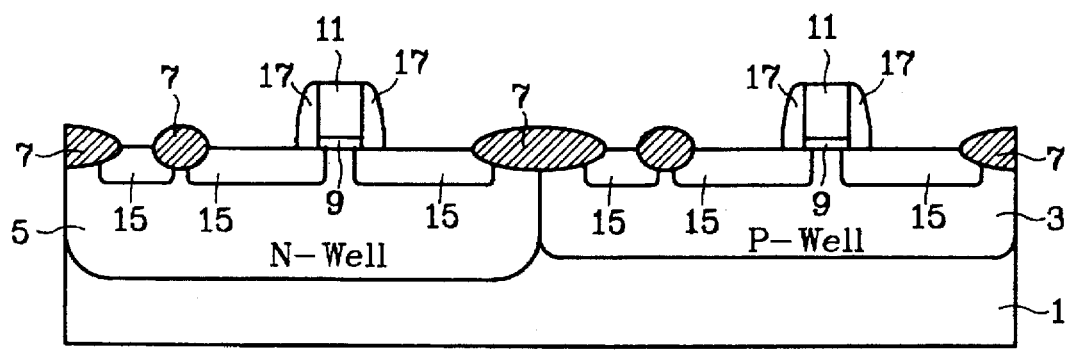
FIG. 5 shows the cross-sectional view of a silicon substrate of FIG. 4 after polysilicon spacers are formed.

Referring to FIGS. 4 and 5, N⁻ LDD 15' is formed by blanket implantation with N-dopant 14 to P-well, as shown in FIG. 4. The first dielectric layer 17 is deposited, and anisotropical etchback using RIE is applied to the dielectric layer 17 to make the first dielectric sidewall spacer 17 of the N-channel polysilicon gate 11 and P-channel polysilicon gate 11, as shown in FIG. 5.

The blanket implant used to make said N⁻ LDD 15' has a dosage of 1E13 to 1E14 atoms/cm², and an ion energy of 20–80 keV. The first dielectric layer 17 is generally intrinsic $SiO_2$ made by low pressure CVD, the reaction gas is $SiH_4$ or TEOS, the reaction temperature ranges from 700°–750° C., the reaction pressure ranges from 0.01 to 1.0 torr, and the layer thickness ranges from 1500–3000 Angstroms. The anisotropical etchback process used on the first dielectric layer 17 can be MERIE, ECR or conventional RIE. MERIE is generally employed in submicron technology, and the plasma gas is usually $CF_4$ and $CHF_3$.

Figure 6:
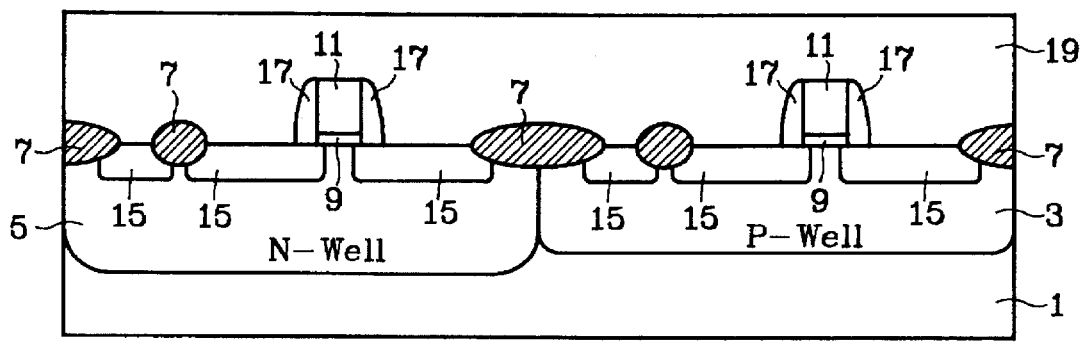
FIG. 6 shows the cross-sectional view of a silicon substrate of FIG. 5 after a layer of PSG is formed.
Figure 7:
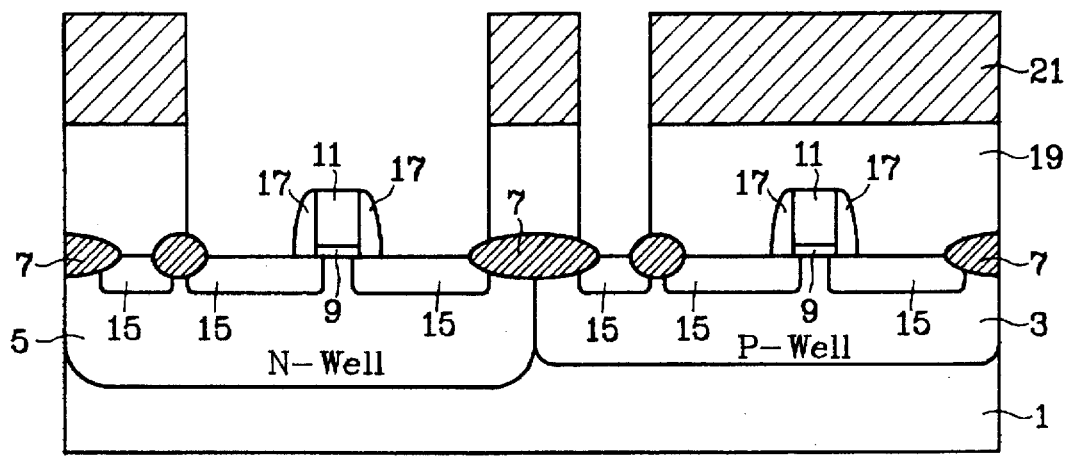
FIG. 7 shows the cross-sectional view of a silicon substrate of FIG. 6 after the layer of PSG is patterned by lithography and plasma-etch techniques.
Figure 8:
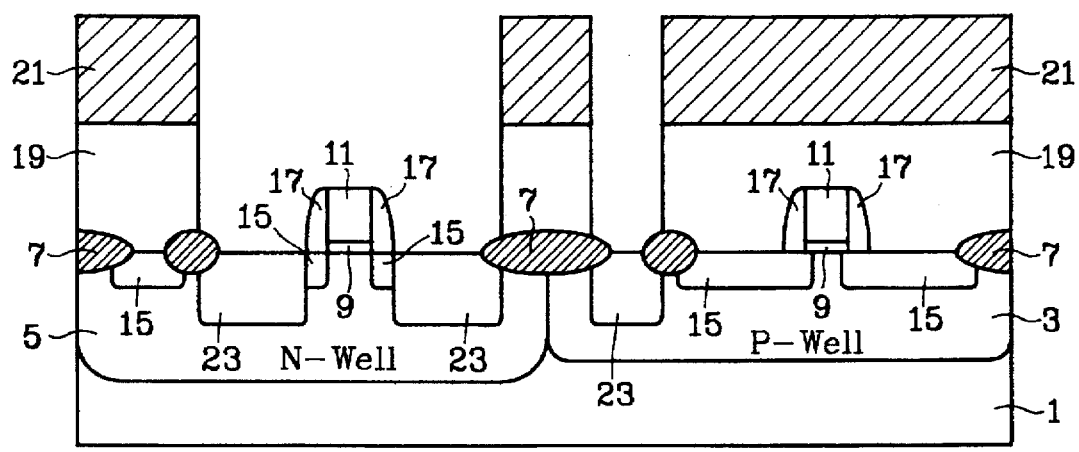
FIG. 8 shows the cross-sectional view of a twin-well CMOS region of FIG. 7 after $P^+$ S/D electrodes are formed in N-well by ion implantation.

Now referring to FIGS. 6, 7 and 8, a layer of PSG 19, as shown in FIG. 6, is deposited. Lithography techniques are used to generate the photoresist pattern 21 to expose the P-type silicon substrate 1 by removing the PSG 19 which covers the N-well 5 and the pickup area of the P-well 3, as shown in FIG. 7. Then ion implantation is used to complete the P⁺ S/D regions 23, as shown in FIG. 8.

The PSG 19 is made by low pressure CVD or APCVD, deposition temperature ranges from 600°–800° C., layer thickness ranges from 3000–6000 Angstroms, solid $P_2O_5$ density ranges from 2–6%. The RIE is used to form the PSG 19 pattern, MERIE, ECR or conventional RIE, reaction gases are $CF_4$ and $CHF_3$. The ion implantation to make the P⁺ S/D uses $BF_2$ ion, dosage ranges from 1E15 to 5E15 atoms/cm², ion energy ranges from 20 to 70 keV.

Figure 9:
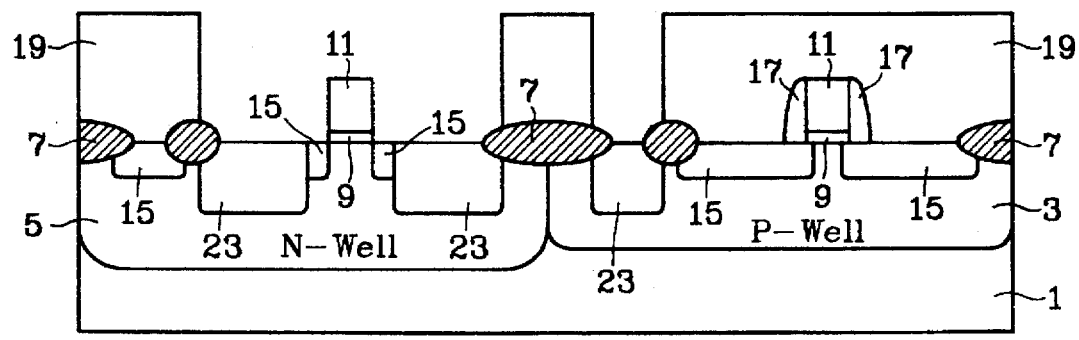
FIG. 9 shows the cross-sectional view of a silicon substrate of FIG. 8 after polysilicon spacers are removed.
Figure 10:
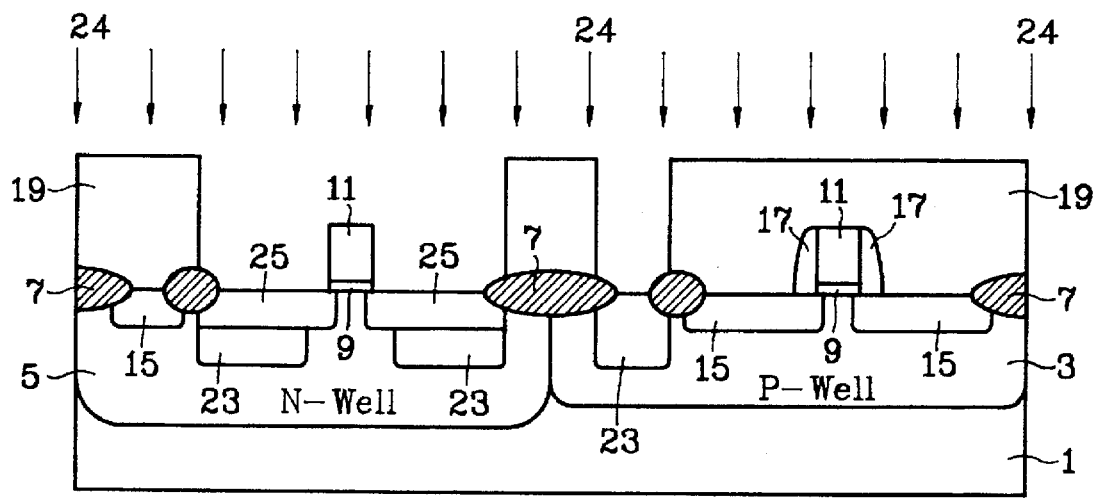
FIG. 10 shows the cross-sectional view of a silicon substrate of FIG. 9 after P-LDD regions are formed by ion implantation.
Figure 11:
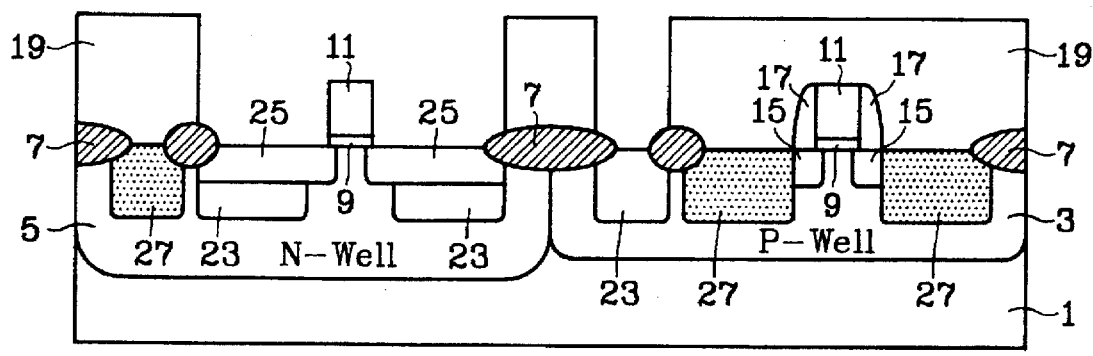
FIG. 11 shows the cross-sectional view of a silicon substrate of FIG. 10 after phosphorus doped of PSG layer is driven in high-temperature diffusion to form $N^+$ S/D.

Referring to FIGS. 9, 10 and 11, the first dielectric spacer 17 on the sidewall of the P-channel polysilicon gate 11, and resist pattern 21 are removed, as shown in FIG. 9. Then, using the PSG 19 as protective mask, blanket implant 24 P-type dopant into the area of N-well not covered by the P-channel polysilicon gate 11, to make the P⁻ LDD 25', as shown in FIG. 10. Then, the PSG 19 is used as an N-type dopant source, a high temperature diffusion process drives the phosphorous dopant of the PSG into the P-well 3 to finish the N⁺ S/D regions (27), as shown in FIG. 11.

The PSG can be replaced by Borosilicate Glass (BSG) as the P-type dopant source to drive boron dopant into the N-well 5 to make P⁺ S/D and pickup area. In this case, the N-type and P-type designation of said process can be reversed wherever it is appropriate.

Figure 12:
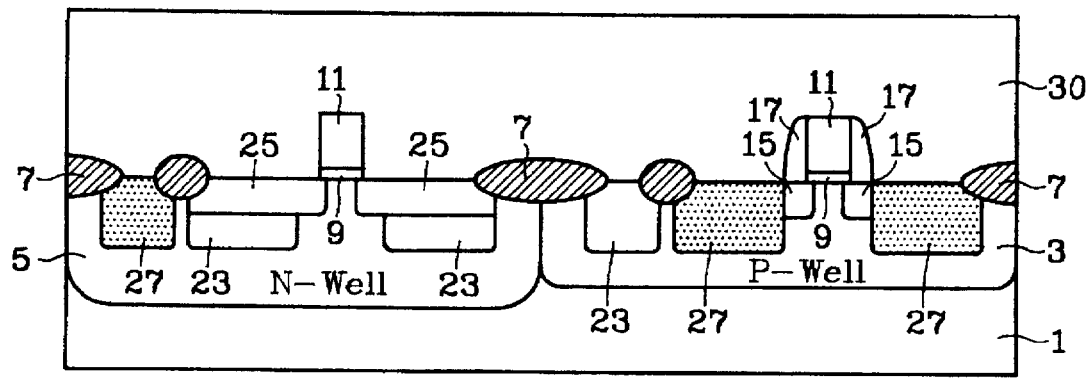
FIG. 12 shows the cross-sectional view of a silicon substrate of a complete CMOS structure after the dielectric layer is formed according to the present invention.

Finally, referring to FIG. 12, dielectric layer 30 is deposited and contact holes to make metal interconnection are formed. A CMOS FET IC with lost cost, shallow junction and no crystal defects is thus completed.

While the invention has been particularly shown and described with reference to the preferred embodiments thereof, it will be understood by those skilled in the art that various changes in form and details may be made without departing from the spirit and scope of the invention.

What is claimed is:

1. A method for fabricating CMOSFET IC, comprising the steps of:

forming N-well and P-well on a silicon substrate;

adjusting threshold voltage by ion implantation;

depositing gate oxide layer overlaying said silicon substrate;

forming a P-channel FET gate and an N-channel FET gate over said silicon substrate;

forming N⁻ lightly doped drains (N⁻ LDD) in said P-well not covered by said N-channel FET gate;

forming dielectric sidewall spacers on said P-channel FET and N-channel FET gates;

depositing and patterning Phosphosilicate glass (PSG) having phosphor dopants by lithography and etching to remove said PSG covering said N-well;

forming P⁺ source/drain regions in said N-well;

removing said dielectric sidewall spacers of said P-channel FET gate;

forming P⁻ lightly doped drains (P⁻ LDD) in said N-well;

driving said phosphor dopants of said PSG into said P-well to form N⁺ source/drain regions;

forming a dielectric layer overlaying entire said silicon substrate and partially etching said dielectric layer to form a plurality of contact holes; and forming a metalization layer filling said contact holes and overlaying said dielectric layer.

2. The method according to claim 1, wherein said N-well is formed by ion implanted arsenic ($As^{75}$) dopants, with an implantation dosage of 1E11 to 1E13 ions/cm², and an implantation energy of 50 to 150 KeV.

3. The method according to claim 1, wherein said N-well is formed by ion implanted phosphorus ($P^{31}$) dopants, with an implantation dosage of 1E11 to 1E13 ions/cm², and an implantation energy of 100 to 300 KeV.

4. The method according to claim 1, wherein said P-well is formed by ion implanted boron ($B^{11}$) dopants, with an implantation dosage of 1E12 to 1E13 ions/cm$^2$, and an implantation energy of 20 to 80 KeV.

5. The method according to claim 1, wherein said gate oxide layer has a thickness of about 80 to 200 Angstroms.

6. The method according to claim 1, wherein said P-channel FET gate and said N-channel FET gate are formed by polysilicon with a thickness of 1000 to 4000 Angstroms.

7. The method according to claim 1, wherein said N$^-$ LDD is formed by an ion implanted arsenic ($As^{75}$) dopants, with an implantation dosage of 1E12 to 1E13 ions/cm$^2$, and an implantation energy of 20 to 80 KeV.

8. The method according to claim 1, wherein said PSG with $P_2O_5$ density ranges from 2 to 6%, and thickness from 3000 to 8000 Angstroms.

9. The method according to claim 1, wherein said P$^+$ source/drain is formed by employing a layer of Borosilicate glass (BSG) as a P-type dopant source wherein Boron dopants of said BSG are into said N-well to create said P$^+$ source/drain.

* * * * *